United States Patent [19]

Koshiishi et al.

[11] Patent Number: 5,252,892

[45] Date of Patent: * Oct. 12, 1993

[54] PLASMA PROCESSING APPARATUS

[75] Inventors: Akira Koshiishi, Kofu; Kohei Kawamura, Nirasaki; Masahiko Matsudo; Naoki Takayama, both of Kofu, all of Japan

[73] Assignee: Tokyo Electron Limited, Tokyo, Japan

[*] Notice: The portion of the term of this patent subsequent to Mar. 31, 2009 has been disclaimed.

[21] Appl. No.: 786,009

[22] Filed: Oct. 31, 1991

Related U.S. Application Data

[63] Continuation-in-part of Ser. No. 480,765, Feb. 16, 1990, Pat. No. 5,089,747.

[30] Foreign Application Priority Data

| Feb. 16, 1989 | [JP] | Japan | 1-39016 |
| Feb. 16, 1989 | [JP] | Japan | 1-39017 |
| Feb. 28, 1989 | [JP] | Japan | 1-46888 |
| Nov. 20, 1990 | [JP] | Japan | 2-314884 |

[51] Int. Cl.$^5$ .............................................. H05H 1/02
[52] U.S. Cl. .................. 315/111.81; 315/111.21; 313/231.31; 250/423 R
[58] Field of Search ............ 315/111.21, 111.81; 313/231.31; 250/423 R, 492.3

[56] References Cited

U.S. PATENT DOCUMENTS

| 4,841,197 | 6/1989 | Takayama et al. | 315/111.81 |
| 4,950,956 | 8/1990 | Asamaki et al. | 315/111.21 |
| 5,028,791 | 7/1991 | Koshiishi et al. | 315/111.81 X |
| 5,049,784 | 9/1991 | Matsudo | 315/111.81 |
| 5,083,061 | 1/1992 | Koshiishi et al. | 315/111.81 |
| 5,089,747 | 2/1992 | Koshiishi et al. | 315/111.81 |
| 5,097,179 | 3/1992 | Takayama et al. | 315/111.81 |
| 5,101,110 | 3/1992 | Matsudo et al. | 315/111.81 X |

FOREIGN PATENT DOCUMENTS 61-121967 6/1986 Japan.
61-290629 12/1986 Japan.

Primary Examiner—Eugene R. LaRoche
Assistant Examiner—Do Hyun Yoo
Attorney, Agent, or Firm—Oblon, Spivak, McClelland, Maier & Neustadt

[57] ABSTRACT

A plasma processing apparatus includes a filament mounted in an electron generation chamber for producing plasma of a discharge gas, thereby generating electrons. The electrons are supplied from the electron generation chamber into an ion generation chamber through electron passage hole between both chambers to produce plasma of a processing gas inside the ion generation chamber. The chambers are formed of conductive ceramics to constitute electrodes.

12 Claims, 4 Drawing Sheets

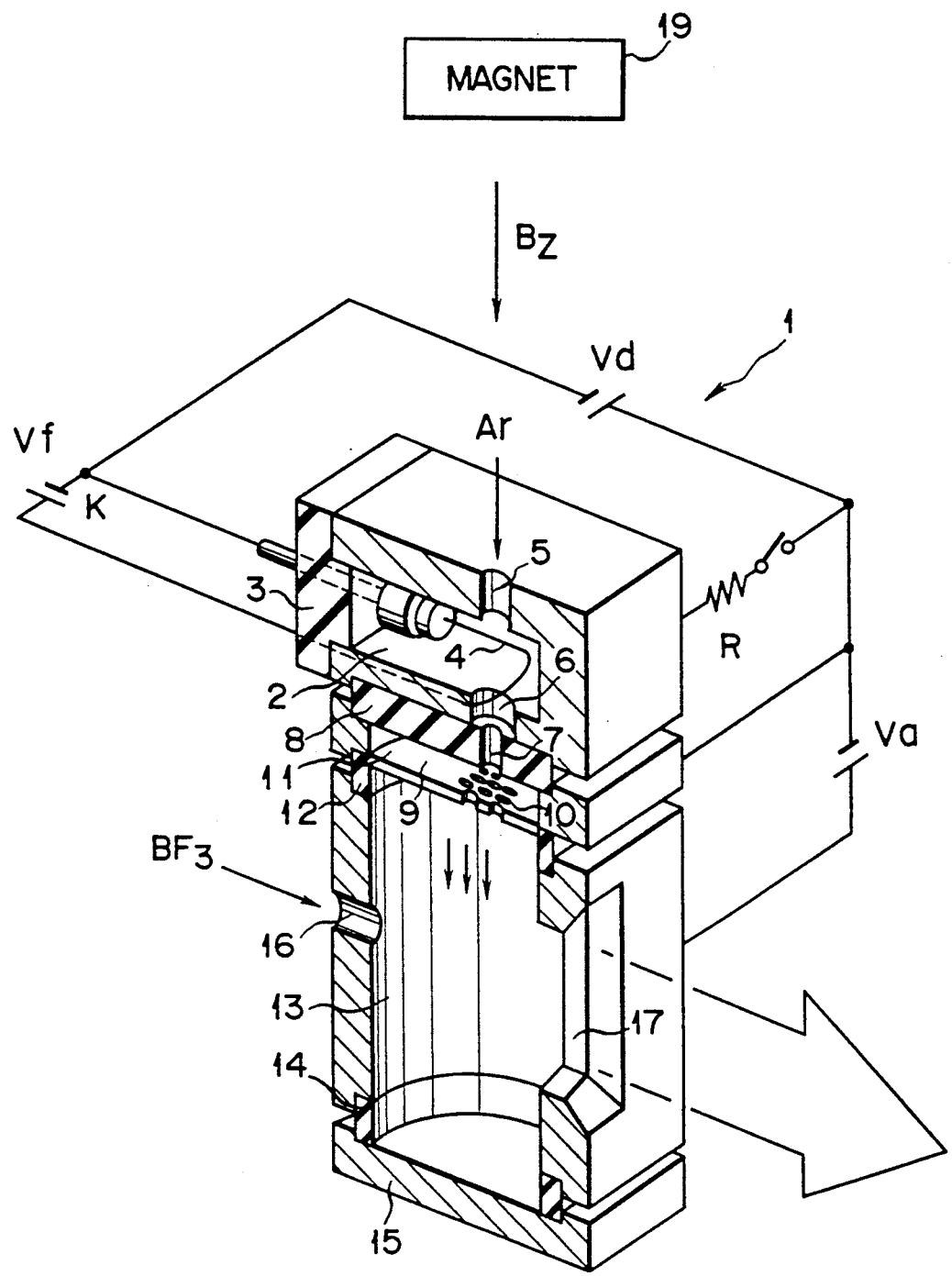
F I G. 1

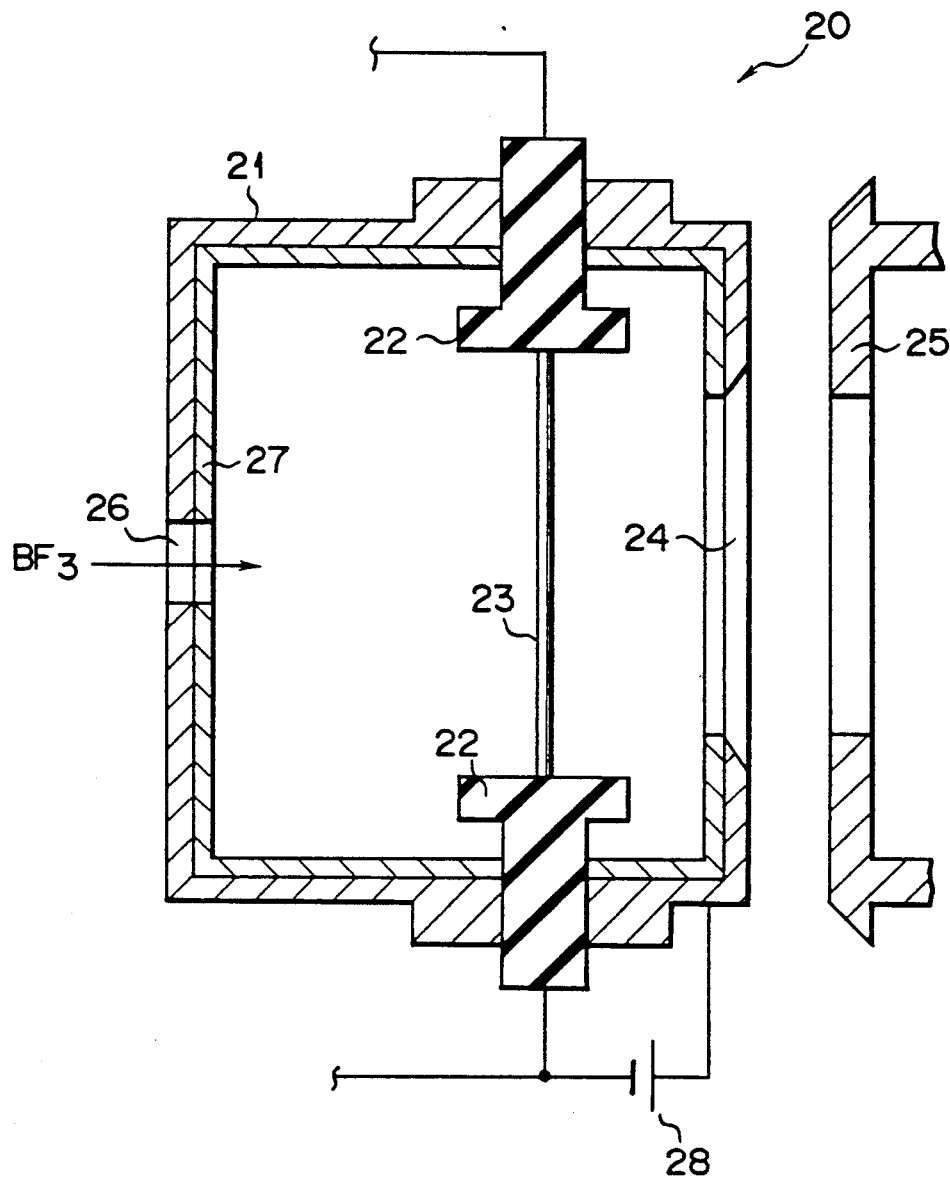
F I G. 3

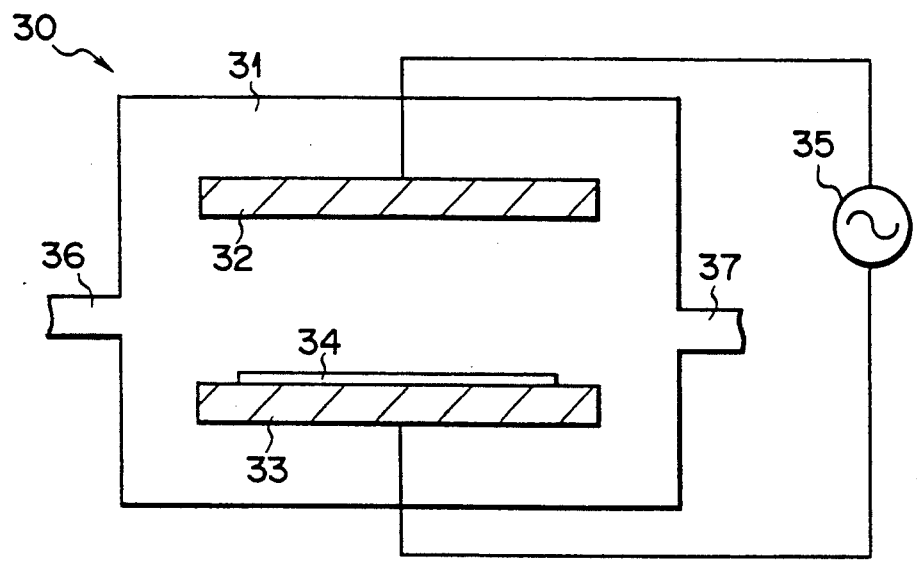
F I G. 4
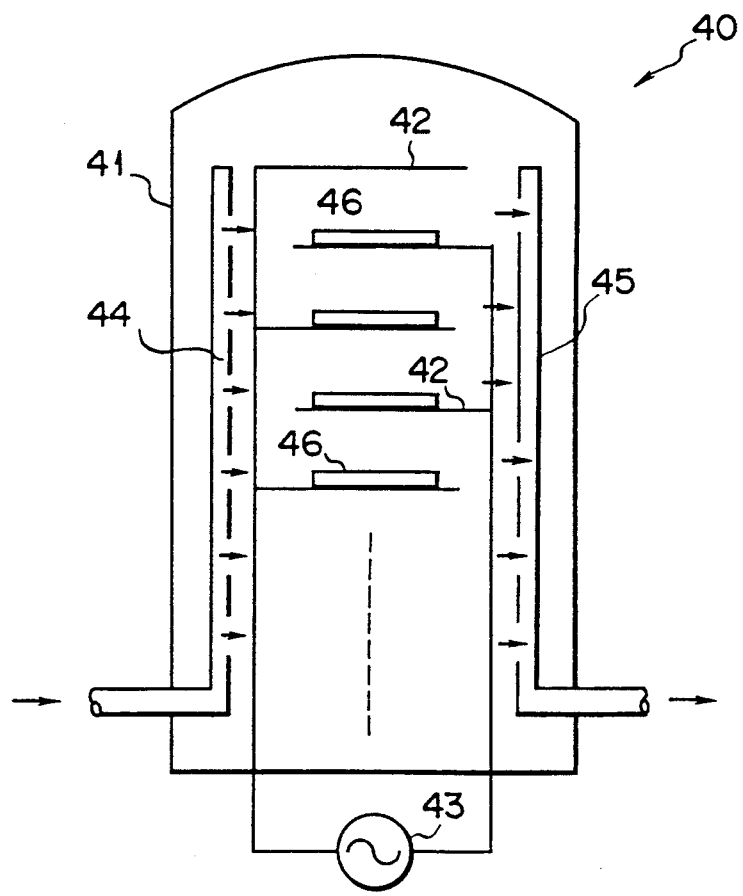
F I G. 5

PLASMA PROCESSING APPARATUS

CROSS-REFERENCES TO THE RELATED APPLICATIONS

This application is a continuation-in-part of the U.S. patent application Ser. No. 480,765, filed on Feb. 16, 1990 now U.S. Pat. No. 5,089,747.

BACKGROUND OF THE INVENTION

1. Field of the Invention

The present invention relates to a plasma processing apparatus, such as an ion source, a CVD apparatus, an etching apparatus, an X-ray source, or the like.

2. Description of the Related Art

In a plasma processing apparatus, a gas is electrically excited to generate plasma, and an object under treatment is processed by utilization of the plasma. In this type of apparatus, a voltage is applied between electrodes made of conductive metals and a gas is introduced into the region between the electrodes, for exciting.

For example, in the electron beam excitation ion source of an ion implantation apparatus which implants ions into a semiconductor wafer as impurities, plasma is produced from a predetermined gas atmosphere by causing discharge between the filament and electrode. A predetermined raw gas (e.g., a $BF_3$ gas) is introduced into an ion generation chamber formed by a high-melting point conductive metal (e.g., molybdenum). Electrons are extracted from the plasma by means of an ion extraction electrode, and are supplied into the raw gas, so as to obtain ions from the raw gas. The ions, thus obtained, are implanted into the semiconductor wafer.

In the ion source which was mentioned above as one type of plasma processing apparatus, the walls of the ion generation chamber are liable to damage due to the action of sputtering or etching caused by the plasma, and particles separating from the walls of the ion generation chamber are liable to attach to undesirable portions of the ion source, such as the ion extraction electrode.

This problem is particularly noticeable when the raw gas used in the plasma processing is highly corrosive, just like $BF_3$. Moreover, in the case where the walls of the ion generation chamber are made of molybdenum and the raw gas is $BF_3$, an insulating material, such as molybdenum fluoride, attaches to the ion extraction electrode, forming an insulating film on the surface of the ion extraction electrode. In order to remove such an insulating film from the ion extraction electrode, the apparatus has to be maintained frequently, resulting in a low rate of operation of the apparatus and poor productivity.

SUMMARY OF THE INVENTION

Accordingly, an object of the present invention is to provide a plasma processing apparatus which need not be maintained as frequently as a conventional apparatus and which therefore ensures a high rate of operation and satisfactory productivity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing an electron beam excitation ion source according to the first embodiment of the present invention;

FIGS. 2A through 2C show an electron beam excitation ion source according to the second embodiment of the present invention, in which FIG. 2A is a sectional view showing the entire structure of the ion source, FIG. 2B is a sectional view of a porous electrode, and FIG. 2C is a plan view of the porous electrode;

FIG. 3 is a view showing the structure of a Freeman type ion source according to the third embodiment of the present invention;

FIG. 4 is a view showing the structure of a plasma etching apparatus according to the fourth embodiment of the present invention; and FIG. 5 is a view showing the structure of a plasma CVD apparatus according to the fifth embodiment of the present invention.

DETAILED DESCRIPTION OF THE PREFERRED EMBODIMENTS

Figure 2A:
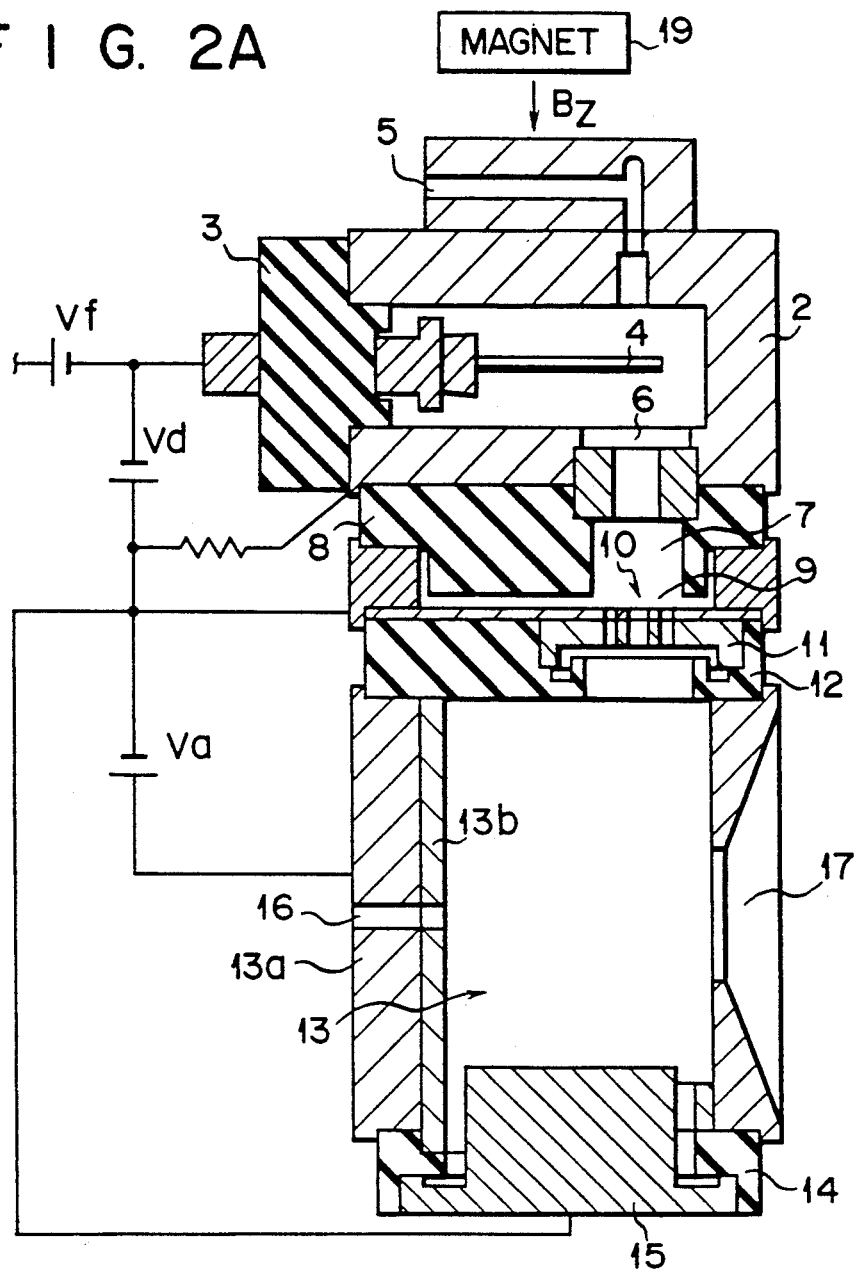

Embodiments of the present invention will now be described with reference to the accompanying drawings.

First, a description will be given of the first embodiment wherein the present invention is applied to an electron beam excitation ion source.

As is shown in FIG. 1, the ion source 1 comprises an electron generation chamber 2 which is located in the upper region thereof and which is like a rectangular container whose sides are of the order of several centimeters in length. The electron generation chamber 2 is made of a high-melting point conductive material, such as conductive ceramics, and has an insulating plate 3 which closes opening at one side of that member. A U-shaped wire 4, formed of e.g. tungsten, is arranged inside the electron generation chamber 2, such that its end portions are supported by the insulating plate 3.

A discharge gas-introducing port 5 is formed in the ceiling of the electron generation chamber 2 so as to introduce a discharge gas (e.g., Ar) into the electron generation chamber 2. A circular hole 6 is formed in the bottom of the electron generation chamber 2 so as to extract electrons from the plasma generated in the electron generation chamber 2. A plate-like insulating member 8, having a through-hole 7, is arranged below the electron generation chamber 2 such that the through-hole 7 is located under the circular hole 6. A plasma cathode chamber 9 formed by a high-melting point conductive member, such as conductive ceramics, is located below the insulating member 8 in such a manner that the plasma cathode chamber 9 is spaced from the electron generation chamber 2 by a certain distance. The bottom of the plasma cathode chamber 9 ia made by a porous electrode 11, and a plurality of through-holes 10 are formed in the porous electrode 11, with the through-holes 10 corresponding in location to the through-hole 7.

Located under the porous electrode 11 is an ion generation chamber 13. The ion generation chamber 13 is spaced from the plasma cathode chamber 9 by means of an insulating member 12. The ion generation chamber 13 is in the form of a container and formed of a high-melting point conductive material, such as conductive ceramics. The internal space of the ion generation chamber 13 defines a cylindrical region whose diameter and height are of the order of several centimeters. A bottom plate 15 is secured to the bottom of the ion generation chamber 13, with an insulating ring member 14 interposed.

A processing gas-introducing port 16 is formed in one of the side walls of the ion generation chamber 13. Through the processing gas-introducing port 16, a processing gas (e.g., $BF_3$) is supplied into the interior of the ion generation chamber 13, so as to generate desirable ions inside the ion generation chamber 13. An ion-extracting slit aperture 17 is formed in such a manner as to oppose the processing gas-introducing port 16. The through-holes 10 formed in the porous electrode 11 are located closer to the ion-extracting port 17 than the central axis of the cylindrical internal region of the ion generation chamber 13, so that the plasma generated in the internal region is most active in the neighborhood of the outlet port 17.

As the conductive ceramics for forming the ion generation chamber 13, the electron generation chamber 2 and the plasma cathode chamber 9, it is preferable to use either "BN Composite EC" (trade name) commercially available from Electrochemical Industry Co., Ltd. or conductive ceramics containing SiC, TiC, $TiB_2$ and $ZrB_2$ as major ingredients.

The filament 4 mentioned above is connected to a filament power source Vf and heated thereby. The electron generation chamber 2 is connected to a discharge power source Vd via a resistor R, and the porous electrode 11 is connected directly to the discharge power source Vd. The region between the porous electrode 11 and the ion generation chamber 13 is connected to an acceleration power source Va, which is arranged in series with the discharge power source Vd.

Desirable ions are produced by the above-mentioned ion source as follows.

By a magnetic field-generating means (i.e., magnet 19), a magnetic field is generated such that it serves to guide electrons in the electron extraction direction, as indicated by arrow Bz in FIG. 1. Simultaneously, the filament power source Vf, the discharge power source Vd and the acceleration power source Va apply predetermined voltages to the respective portions of the ion source.

A discharge gas (e.g., Ar) is introduced from the discharge gas-introducing port 5 into the electron generation chamber 2 at a flow rate of 0.4 SCCM, for example. Plasma is generated, with electric discharge being caused in the electron generation chamber 2. The electrons contained in the plasma are accelerated by an electric field, and are supplied into the plasma cathode chamber 9 after passing through the circular hole 6 and through-hole 7. As a result, plasma is generated in the plasma cathode chamber 9 as well.

The electrons contained in the plasma generated in the plasma cathode chamber 9 are accelerated by electron acceleration voltage Va, pass via the through-holes 10 of the electrode 11, and are guided to the region in the vicinity of the slit aperture 17.

The inside of the ion generation chamber 13 is supplied with a raw gas (e.g., $BF_3$) beforehand. The raw gas is supplied through the port 16 at a predetermined flow rate (e.g., 0.7 SCCM). The electrons flowing into the ion generation chamber 13 efficiently collide against the molecules of the raw gas by means of the reflecting electrode 15 and magnetic field, thus generating dense plasma.

The ions are guided from the ion generation chamber 13 through the slit aperture 17 by means of an ion extraction electrode (not shown), so as use them for such processing as ion implantation of semiconductor wafers.

Inside the ion generation chamber 13, a high-corrosive raw gas (e.g., $BF_3$) is excited upon electron irradiation, so that the plasma generated in the ion generation chamber 13 is made more reactive. In the ion source of the first embodiment, however, the ion generation chamber 13 is formed with conductive ceramics, as mentioned above. Therefore, the walls of the ion generation chamber 13 are not much damaged, in comparison with the conventional case. Further, the ion extraction electrode is not much contaminated, due to flying particles. Accordingly, the apparatus need not be maintained frequently, and a high rate of operation of the apparatus and satisfactory productivity are ensured.

In the first embodiment mentioned above, not only the ion generation chamber 13 but also the electron generation chamber 2 and the plasma cathode chamber 9 are formed of conductive ceramics. However, the electron generation chamber 2 and the plasma cathode chamber 9 need not be formed of conductive ceramics; they may be formed of a high-melting point conductive metal, such as molybdenum.

Figure 2B:
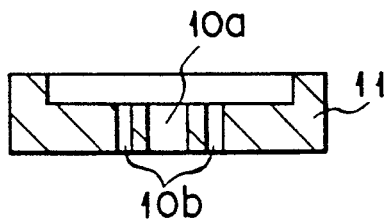

The second embodiment of the present invention will be described, with reference to FIGS. 2A through 2C. Of the structural components employed in the second embodiment, those which are substantially similar to the structural components will be referred to by using the same reference numbers, and explanation of such structural components will be omitted.

In the second embodiment, the peripheral wall of the ion generation chamber 13 is of a double structure made up of an outer cylinder 13a formed of a metal such as molybdenum, and an inner cylinder (liner) 13b formed of conductive ceramics. The bottom wall of the ion generation chamber 13 is formed of conductive ceramics, but may be of a double structure, just like the peripheral wall.

Figure 2C:
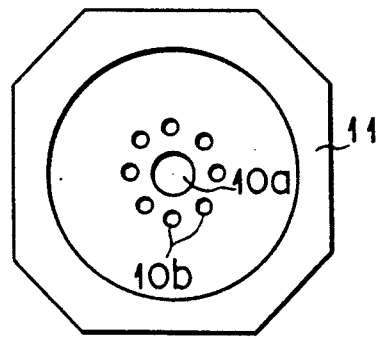

As is shown in FIG. 2C, the porous electrode 11 employed in the second embodiment has a large-diameter through-hole 10a located in the center, and a plurality of small-diameter through-holes 10b (e.g., eight through-holes) located around the large-diameter through-hole 10a. The small-diameter through-holes 10b are spaced from each other at predetermined intervals.

The third embodiment wherein the present invention is applied to a Freeman type ion source will be described, with reference to FIG. 3.

As is shown in FIG. 3, the Freeman type ion source 20 comprises a cylindrical chamber 21, and a rod-shaped filament 23 extends through the interior of the cylindrical chamber 21. The two ends of the rodshaped filament 23 are supported by insulating support members 22.

An ion extraction opening 24 is formed in the front wall of the chamber 21, and an ion extraction electrode 25 is arranged outside the chamber 21 such that the ion extraction electrode 25 opposes the ion extraction opening 24. A raw gas-introducing opening 26 is formed in the rear wall of the chamber 21. The inner wall of the chamber 21 is covered with a liner 27 formed of conductive ceramics. The liner 27 is formed of either "BN Composite EC" (trade name) commercially available from Electrochemical Industry Co., Ltd. or conductive ceramics containing SiC, TiC, $TiB_2$ and $ZrB_2$ as major ingredients.

In the Freeman type ion source 20 mentioned above, the filament 23 is applied with a predetermined voltage by means of a filament power source (not shown), such that a current in the range of e.g. 50 to 200A flows through the filament 23. Further, a discharge voltage of the order of e.g. 80 to 100V is applied between the filament 23 and the chamber 21 by means of a discharge power source 28. A predetermined raw gas (e.g., $BF_3$) is introduced into the chamber 21 through the raw gas-introducing opening 26, so that the raw gas is ionized due to the electric discharge occurring in the chamber 21. The ions produced by the electric discharge are extracted from the ion extraction opening 24 by means of the ion extraction electrode 25, so as use them for such processing as ion implantation of semiconductor wafers.

In the third embodiment, the discharge power source 28 applies a discharge voltage such that the potential of the wall of the chamber 21 is higher than that of the filament 23. Therefore, the ions are attracted to the inner wall of the chamber 21. However, the inner wall of the chamber 21 is not damaged by a corrosive gas ($BF_3$) since it is covered with the liner 27 formed of conductive ceramics, as mentioned above. Thus, the advantages of the third embodiment are similar to those of the first and second embodiments.

In the third embodiment, the entirety of the chamber 21 may be formed of conductive ceramics, instead of covering the inner wall with the liner 27.

The fourth embodiment wherein the present invention is applied to a plasma etching apparatus will be described, with reference to FIG. 4.

As is shown in FIG. 4, the plasma etching apparatus 30 comprises a chamber 31 which is formed of e.g. quartz and the interior of which can be hermetically sealed. Inside the chamber 31, upper and lower electrodes 32 and 33, which are in the form of disks, are arranged in parallel in such a manner as to face each other. The lower electrode 33 is adapted to hold a semiconductor wafer 34 (i.e., an object to be treated) mounted thereon. The upper and lower electrodes 32 and 33 are formed of conductive ceramics similar to those mentioned with reference to the first to third embodiments, and are connected to a high-frequency power source 35.

A gas-introducing pipe 36 and a gas-discharging pipe 37 are connected to the chamber 31, so that a gaseous atmosphere of predetermined pressure can be produced inside the chamber 31.

The semiconductor wafer 34 is etched by the procedures below. With the chamber 31 opened by means of an opening/closing mechanism (not shown), the semiconductor wafer 34 is placed on the lower electrode 33. Subsequently, the chamber 31 is closed by the opening/closing mechanism, so as to hermetically seal the chamber 31.

Thereafter, the gas in the chamber 31 is discharged through the gas-discharging pipe 37, and a predetermined processing gas (i.e., an etching gas) is introduced into the chamber 31 through the gas-introducing pipe 36, until the pressure in the chamber 31 reaches a predetermined value.

Power having a predetermined frequency (e.g., 2.45 GHz, 13.75 MHz, 435 KHz, etc.) is applied between the upper electrode 32 and the lower electrode 33 by the high-frequency power source 35, so that the processing gas in the chamber 31 is converted into plasma. The semiconductor wafer 34 is etched, with the plasma acting thereon.

In the fourth embodiment mentioned above, the upper and lower electrodes 32 and 33 are formed of conductive ceramics similar to those mentioned with reference to the first to third embodiments. Therefore, they are prevented from being damaged by ions or a corrosive gas. Thus, the advantages of the fourth embodiment are similar to those of the first to third embodiments.

The fifth embodiment wherein the present invention is applied to a plasma CVD apparatus will be described, with reference to FIG. 5.

As is shown in FIG. 5, the plasma CVD apparatus 40 comprises a cylindrical chamber 41 which is formed of e.g. quartz and the interior of which can be hermetically sealed. Inside the chamber 31, electrode plates 42, which are in the form of disks, are arranged in parallel like shelves. The electrode plates 42 are connected to a high-frequency power source 43 in such a manner that the adjacent two electrode plates 42 are connected to the opposite-polarity terminals of the power source 43. More specifically, if the uppermost electrode plate 42 is connected to the positive terminal of the power source 43, the second electrode plate 42 is connected to the negative terminal of the power source 43, the third electrode plate 42 to the positive terminal, the fourth electrode plate 42 to the negative terminal, and the like. The electrode plates 42 are formed of conductive ceramics, as in the first to fourth embodiments.

Inside the chamber 41, a processing gas-introducing region 44 and a gas-discharging region 45 are defined such that they oppose each other, with the electrode plates 42 located therebetween. As indicated by the arrows in FIG. 5, a predetermined processing gas (i.e., a CVD gas) is made to flow through the region between the adjacent electrode plates 42.

In the fifth embodiment mentioned above, a semiconductor wafer 46 (which is an example of an object to be treated) is placed on each electrode plate 42, except on the uppermost one.

A gas in the chamber 41 is discharged from the gas-discharging region 45, and the processing gas is introduced from the processing gas-introducing region 44. With the processing gas flowing through the region between the adjacent electrode plates 42, high-frequency power is applied between the adjacent plates 42 by the high-frequency power source 43. Due to the application of the high-frequency power, the processing gas flowing between the electrode plates 42 is converted into plasma, with the result that a CVD film is formed on each semiconductor wafer 46.

The electrode plates 42 employed in the fifth embodiment are formed of conductive ceramics similar to those mentioned with reference to the first to fourth embodiments. Since, therefore, they are prevented from being damaged by ions, the advantages of the fifth embodiment are similar to those of the foregoing embodiments.

When the foregoing embodiments were described, reference was made to the case where the present invention was applied to an electron beam excitation ion source, a Freeman type ion source, a plasma etching apparatus, and a plasma CVD apparatus. However, the present invention is in no way limited to such embodiments. It can be applied to any type of apparatus as long as the apparatus utilizes plasma. It can be applied to an X-ray source, for example.

As has been described, the damage due to ions can be suppressed in a plasma processing apparatus embodying the present invention. Since the apparatus need not be frequently maintained, a high rate of operation of the apparatus and satisfactory productivity are ensured.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A plasma processing apparatus comprising: a container having a plasma generation region;

means for introducing a processing gas into the plasma generation region;

at least one electrode having a surface directly exposed in the plasma generation region and formed of conductive ceramic;

means for applying a voltage to the conductive ceramic surface of the electrode; and means for generating plasma of the processing gas in the plasma generation region in cooperation with the conductive ceramic surface of the electrode.

2. A plasma processing apparatus according to claim 1, wherein the surface formed of conductive ceramic includes a circumferential inner surface of the container.

3. A plasma processing apparatus according to claim 1, wherein said electrode is positioned in the container and made of conductive ceramic for supporting an object to be treated.

4. A plasma processing apparatus comprising:

an electron generation chamber having a discharge gas-introducing port and an electron passage hole;

means for producing plasma of a discharge gas in the electron generation chamber, thereby generating electrons;

an ion generation chamber defining a plasma generation region therein and having a processing gas-introducing port, an ion extraction opening and an electrode section formed of conductive ceramic and exposed in the plasma generation region; and means for supplying the electrons from the electron generation chamber into the plasma generation region through the electron passage hole while simultaneously accelerating the electrons, to produce a plasma of a processing gas in the plasma generation region.

5. A plasma processing apparatus according to claim 4, wherein said ion generation chamber comprises a peripheral wall formed of conductive ceramic and having a peripheral surface exposed in the plasma generation region and constituting the electrode section.

6. A plasma processing apparatus according to claim 4, wherein said ion generation chamber comprises an inner cylinder having a surface exposed in the plasma generation region and formed of conductive ceramic, and an outer cylinder formed of a metal.

7. A plasma processing apparatus according to claim 6, wherein said means for supplying the electrons includes a porous electrode arranged between the electron passage hole and the ion generation chamber.

8. A plasma processing apparatus according to claim 7, wherein said porous electrode includes a conductive plate having a plurality of electron passage holes.

9. A plasma processing apparatus according to claim 8, wherein said electron passage holes of the porous electrode are located near the ion extraction opening, whereby the plasma in the ion generation chamber is most active near the ion extraction opening.

10. A plasma processing apparatus according to claim 9, wherein said electron passage holes of the porous electrode include a large-diameter hole, and a plurality of small-diameter holes located around the large-diameter hole.

11. A plasma processing apparatus according to claim 8, further comprising a plasma cathode chamber positioned between the electron generation chamber and the ion generation chamber, the plasma cathode chamber having one wall constructed by the porous electrode and an opposite wall constructed by a part of the electron generation chamber.

12. A plasma processing apparatus according to claim 4, wherein said conductive ceramic contains at least one of $SiC$, $TiC$, $TiB_2$, and $ZrB_2$.

* * * * *

UNITED STATES PATENT AND TRADEMARK OFFICE
CERTIFICATE OF CORRECTION

PATENT NO. : 5,252,892
DATED : October 12, 1993
INVENTOR(S) : Akira Koshiishi et al.

It is certified that error appears in the above-indentified patent and that said Letters Patent is hereby corrected as shown below:

On the title page, Item [30] and [75],

The third Foreign Application Priority Data, should be deleted.

The second inventor's city, should read: --Mirasaki--

Signed and Sealed this

Twelfth Day of April, 1994

Attest:

BRUCE LEHMAN

*Attesting Officer*   *Commissioner of Patents and Trademarks*